(12) United States Patent
Berman et al.

(10) Patent No.: US 10,922,025 B2
(45) Date of Patent: Feb. 16, 2021

(54) NONVOLATILE MEMORY BAD ROW MANAGEMENT

(71) Applicant: SAMSUNG ELECTRONICS CO., LTD., Suwon-si (JP)

(72) Inventors: Amit Berman, Ramat-Gan (IL); Ariel Doubchak, Ramat-Gan (IL); Noam Livne, Ramat-Gan (IL)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 27 days.

(21) Appl. No.: 16/514,195

(22) Filed: Jul. 17, 2019

(65) Prior Publication Data

US 2021/0019082 A1    Jan. 21, 2021

(51) Int. Cl.
| | |
|---|---|
| G06F 3/06 | (2006.01) |
| G06F 11/10 | (2006.01) |
| G11C 13/00 | (2006.01) |
| G11C 29/52 | (2006.01) |

(52) U.S. Cl.
CPC .......... *G06F 3/0659* (2013.01); *G06F 3/0604* (2013.01); *G06F 3/0644* (2013.01); *G06F 3/0679* (2013.01); *G06F 11/1068* (2013.01); *G11C 13/0004* (2013.01); *G11C 13/004* (2013.01); *G11C 13/0069* (2013.01); *G11C 29/52* (2013.01)

(58) Field of Classification Search
CPC .... G06F 3/0659; G06F 3/0604; G06F 3/0644; G06F 3/0679; G06F 11/1068; G11C 13/0004; G11C 13/004; G11C 13/0069; G11C 29/52
See application file for complete search history.

(56) References Cited

U.S. PATENT DOCUMENTS

| | | | | |
|---|---|---|---|---|
| 2003/0023925 A1* | 1/2003 | Davis | ............ | G11C 29/42 |
| | | | | 714/763 |
| 2005/0057961 A1* | 3/2005 | Ahmad | ............ | G11C 29/804 |
| | | | | 365/154 |
| 2005/0270944 A1* | 12/2005 | Yoshida | ............ | G11B 20/1883 |
| | | | | 369/53.17 |
| 2008/0148004 A1* | 6/2008 | Iren | ............ | G06F 12/0238 |
| | | | | 711/170 |
| 2012/0173920 A1* | 7/2012 | Park | ............ | G11C 29/82 |
| | | | | 714/6.11 |
| 2013/0007544 A1* | 1/2013 | Nemazie | ............ | G11C 29/4401 |
| | | | | 714/723 |

(Continued)

OTHER PUBLICATIONS

M. Goudarzi and T. Ishihara, "Row/column redundancy to reduce SRAM leakage in presence of random within-die delay variation," Proceeding of the 13th international symposium on Low power electronics and design (ISLPED '08), Bangalore, 2008, pp. 93-98. (Year: 2008).*

*Primary Examiner* — Kyle Vallecillo
(74) *Attorney, Agent, or Firm* — F. Chau & Associates, LLC

(57) ABSTRACT

A memory system including a nonvolatile memory (NVM) device and a controller is provided. The NVM device includes a main region and a spare region. The controller writes write data to a selected row of the main region, determines whether the written row is bad, and writes the write data to a spare address in the spare region and writes the spare address to the bad row, when the written row is determined to be bad.

16 Claims, 9 Drawing Sheets

(56) References Cited

U.S. PATENT DOCUMENTS

| | | | |
|---|---|---|---|
| 2014/0289559 A1* | 9/2014 | Hashimoto | G11C 29/08 |
| | | | 714/27 |
| 2015/0019804 A1* | 1/2015 | Nemazie | G11C 29/4401 |
| | | | 711/105 |
| 2015/0193302 A1* | 7/2015 | Hyun | G06F 11/108 |
| | | | 714/764 |
| 2015/0193303 A1* | 7/2015 | Katagiri | G11B 20/1833 |
| | | | 714/764 |
| 2015/0228352 A1* | 8/2015 | Choi | G11C 16/0483 |
| | | | 365/185.2 |
| 2017/0084346 A1* | 3/2017 | Yang | G11C 13/0033 |
| 2017/0169905 A1* | 6/2017 | Walton | G06F 3/0619 |
| 2018/0083651 A1* | 3/2018 | Song | H03M 13/2906 |
| 2019/0237154 A1* | 8/2019 | Choi | G11C 29/02 |
| 2020/0098438 A1* | 3/2020 | Lu | G11C 29/44 |

* cited by examiner

NONVOLATILE MEMORY BAD ROW MANAGEMENT

BACKGROUND

1. Technical Field

Exemplary embodiments of the present inventive concept relate to management of bad rows in a nonvolatile memory, and more particularly to management of bad rows in a phase-change memory.

2. Discussion of Related Art

Semiconductor memory devices may be generally classified as volatile or nonvolatile. Volatile memories such as dynamic random access memory (DRAM), static random access memory (SRAM), and the like lose stored data in the absence of applied power. In contrast, nonvolatile memories such as electrically erasable programmable read-only memory (EEPROM), ferroelectric random access memory (FRAM), phase-change memory (also known as phase random access memory (PRAM)), magnetoresistive random access memory (MRAM), flash memory, and the like are able to retain stored data in the absence of applied power. Among these types of nonvolatile memory, phase-change memory can offer higher performance in applications where writing quickly is important, both because the memory element can be switched more quickly, and also because single bits may be changed to either 1 or 0 without need to first erase an entire block of cells. Further, phase-change memory devices can endure a large amount of program/erase (P/E) cycles compared to flash memory. Due to these factors, phase-change memory has been widely adopted for use in nonvolatile memory roles that are performance-limited by memory access timing.

However, once a very small number of rows (lines) of phase-change memory become worn-out, and the capacity of the phase-change memory falls below a certain threshold, the device reaches an end of life even if all other rows are very far from their end of life.

SUMMARY

According to an exemplary embodiment of the inventive concept, a memory system includes a nonvolatile memory (NVM) and a controller. The NVM includes a main region and a spare region. The controller writes write data to a selected row of the main region, determines whether the written row is bad, and writes the write data to a spare address in the spare region and writes the spare address to the bad row, when the written row is determined to be bad.

According to an exemplary embodiment of the inventive concept, a method of writing to a memory system includes: writing write data to a selected row of a main region of a nonvolatile memory (NVM) of the memory system; determining whether the written row is bad; upon determining that the written row is bad, writing the write data to a spare address in a spare region of the NVM; and writing the spare address to the bad row so the data can be accessed by referencing the bad row.

According to an exemplary embodiment of the inventive concept, a memory system includes a nonvolatile memory (NVM) and a controller. The NVM includes a main region and a spare region. The controller performs a read to read information from a row of the main region, performs a first error correction code (ECC) decoding operation on the read information to generate first data, and determine whether the first ECC decoding operation is successful. The controller outputs the first data to a host when it determines the first ECC decoding operation is successful. The controller performs a second ECC decoding operation on the read information to generate a spare address of the spare region, and outputs second data that resides in the spare address to the host, when the first ECC decoding operation is not successful.

According to an exemplary embodiment of the inventive concept, a method of read data from a memory system includes: performing a read to read information from a row of a main region of a nonvolatile memory (NVM) of the memory system; performing a first error correction code (ECC) decoding operation on the read information to generate first data; outputting the first data to a host when the first ECC decoding operation is successful; performing a second ECC decoding operation on the read information to generate a spare address of a spare region of the NVM, and outputting second data that resides in the spare address to the host, when the first ECC decoding operation is not successful.

BRIEF DESCRIPTION OF THE DRAWINGS

The present inventive concept will become more apparent by describing in detail exemplary embodiments thereof with reference to the attached drawings, in which.

DETAILED DESCRIPTION

Figure 1:
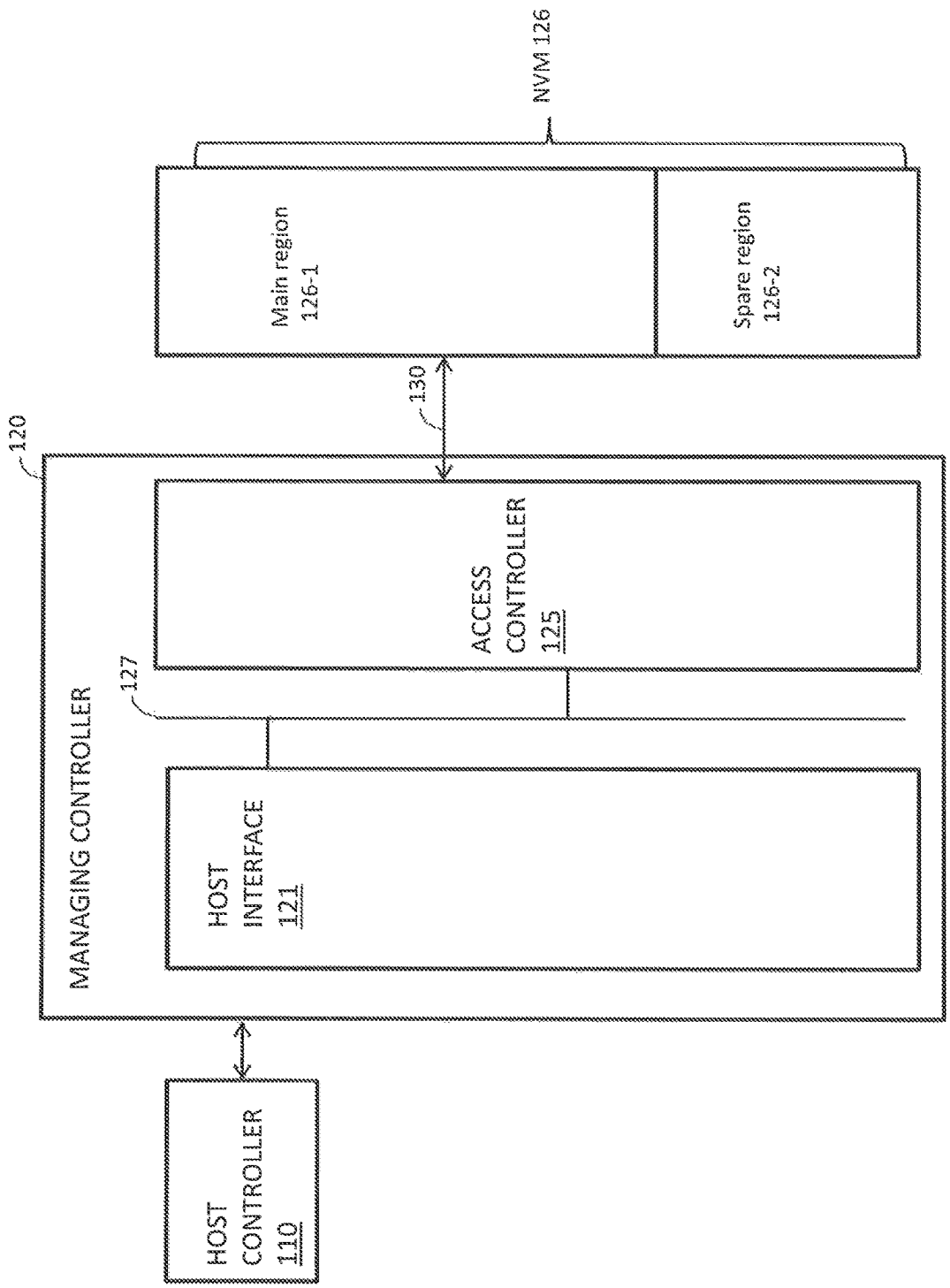
FIG. 1 is a block diagram illustrating a memory system in accordance with an exemplary embodiment of the present inventive concept.

Hereinafter, exemplary embodiments of the inventive concept in conjunction with accompanying drawings will be described. Below, details, such as detailed configurations and structures, are provided to aid a reader in understanding embodiments of the inventive concept. Therefore, embodiments described herein may be variously changed or modified without departing from embodiments of the inventive concept.

Modules in the drawings or the following detailed description may be connected with other modules in addition to the components described in the detailed description or illustrated in the drawings. Each connection between the modules or components may be a connection by communication or may be a physical connection.

FIG. 1 is a block diagram illustrating a memory system in accordance with an exemplary embodiment of the inventive concept.

Referring to FIG. 1, the memory system includes a host controller 110 and a managing controller 120 (e.g., a solid state disk (SSD) controller).

The host controller 110 controls read and write operations of the managing controller 120 and may correspond to a central processing unit (CPU), for example. The controller 120 stores data when performing a write operation and outputs stored data when performing a read operation under the control of the host controller 110. The controller 120 includes a host interface 121 and an access controller 125. The access controller 125 is configured to interface with a nonvolatile memory device 126. In an exemplary embodiment, the nonvolatile memory device 126 is implemented by a phase-change memory device. The nonvolatile memory device 126 includes a main region 126-1 and a spare region 126-2.

The host interface 121 may be connected with a host (e.g., see 4100 in FIG. 8) via any one of a Parallel AT Attachment (PATA) bus and Serial AT Attachment (SATA) bus. The host interface 121 may provide an interface with controller 125 according to the protocol of a host. The host interface 121 may communicate with the host using Universal Serial Bus (USB), Small Computer System Interface (SCSI), PCI express. ATA, Parallel ATA (PATA), Serial ATA (SATA), or Serial Attached SCSI (SAS). The host interface 121 may perform a disk emulation function which enables the host to recognize the controller 125 as a hard disk drive (HDD). In an exemplary embodiment, the controller 125 is configured to interface with the nonvolatile memory 126 or a DRAM (not shown) using a Double data rate (DDR) protocol.

Figure 4A:
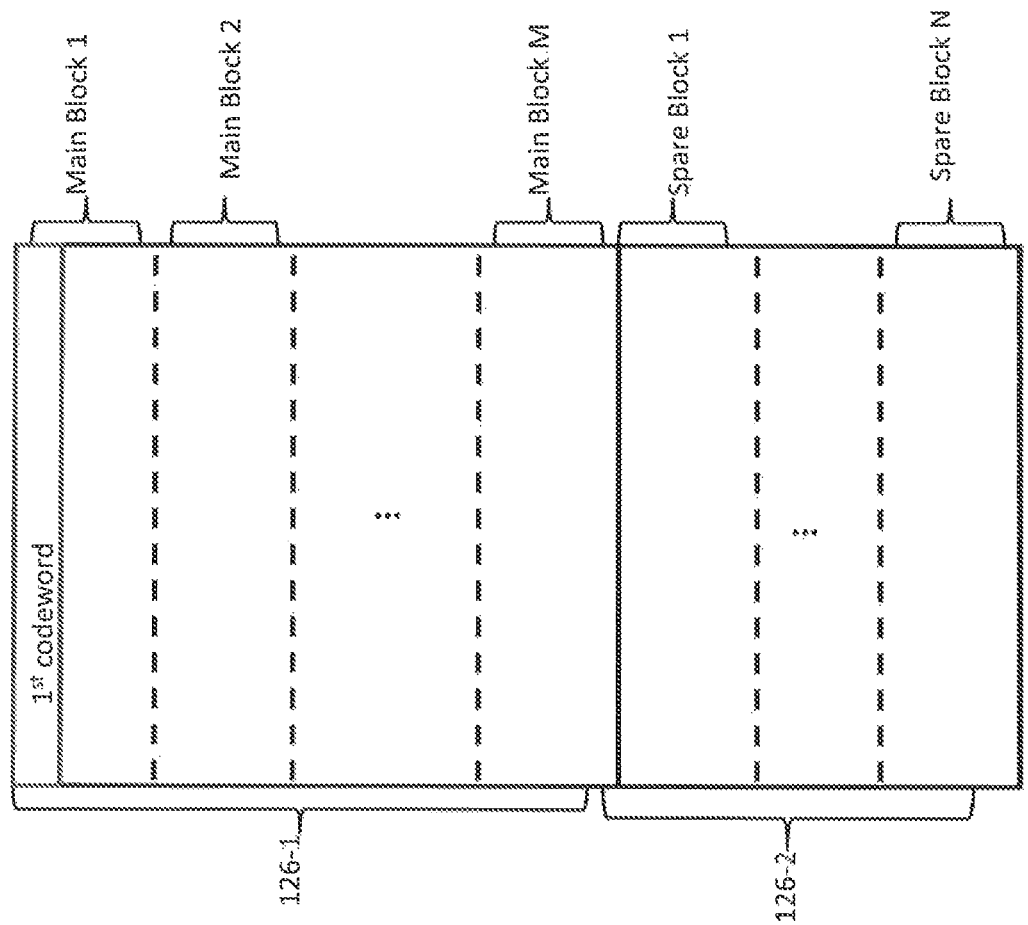
FIG. 4A and FIG. 4B illustrate exemplary states of a memory of the memory system during the writing.
Figure 4B:
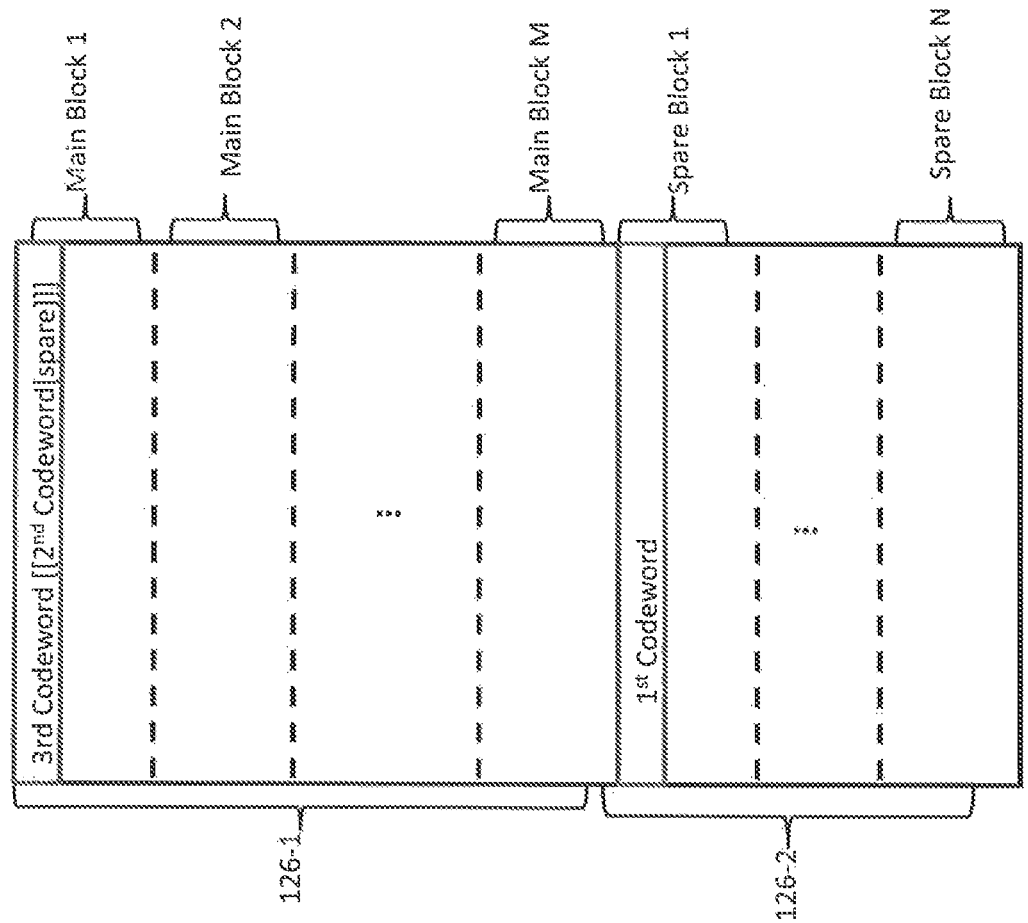

The controller 125 is configured to write data to either the main region 126-1 or the spare region 126-2 of the memory device 126, and read data from either the main region 126-1 or the spare region 126-2. The memory device 126 may include one or more non-volatile memory devices. In an exemplary embodiment, the non-volatile memory devices are phase-change memories. As shown in FIGS. 4A-4B, the main region 126-1 includes M blocks and the spare region 126-2 includes N blocks. In an exemplary embodiment, M and N are integer values greater than 1 and M is greater than N.

The host controller 110 exchanges signals with the managing controller 120 through the host interface 121. The access controller 125 controls an access operation on a memory in which data will be stored within the memory device 126 when a write operation is performed and controls an access operation on a memory in which data to be outputted is stored within the memory device 126 when a read operation is performed. The memory device 126 stores data when a write operation is performed and outputs stored data when a read operation is performed. The access controller 125 and the memory device 126 communicate with one another through a data channel 130. While only a single memory device 126 is illustrated in FIG. 1, the inventive concept is not limited thereto. For example, the access controller 125 may communicate with multiple memory devices across multiple channels or with multiple memory devices across a single channel.

Figure 2:
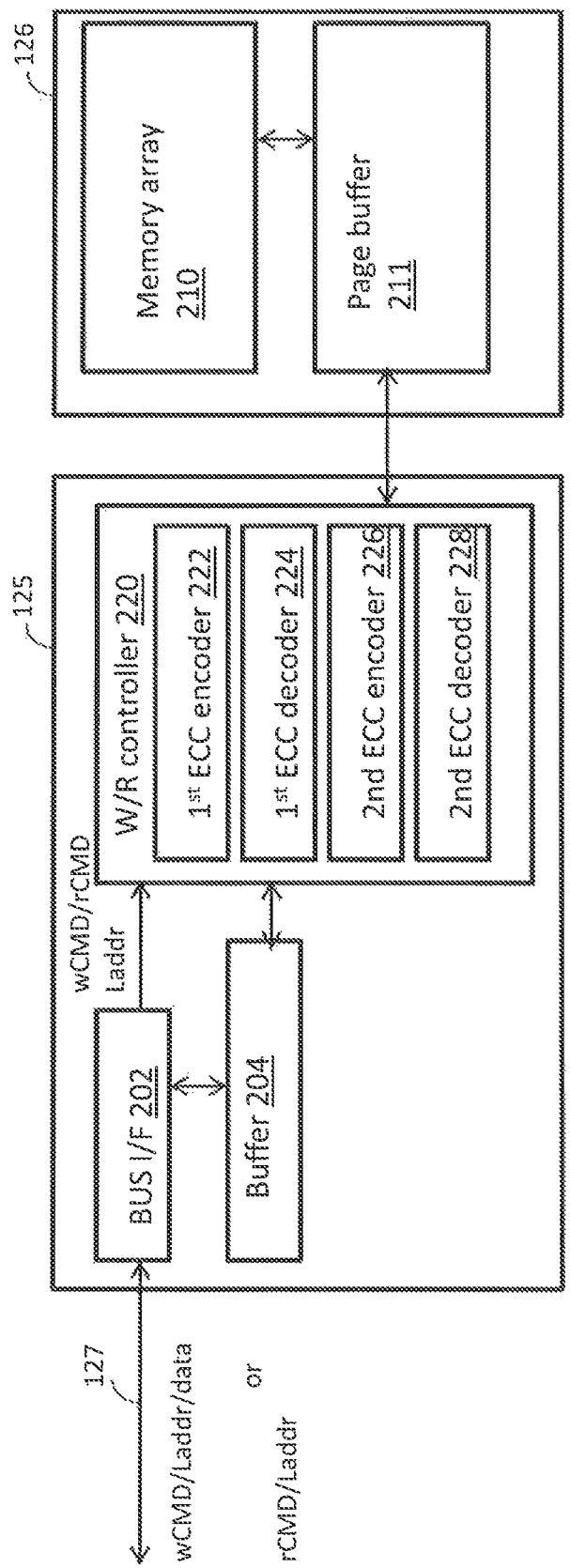
FIG. 2 is a block diagram of a controller and a memory device of FIG. 1 according to an exemplary embodiment of the inventive concept.

FIG. 2 is a block diagram of the access controller 125 and the memory device 126 of FIG. 1 according to an exemplary embodiment of the inventive concept. FIG. 2 will be discussed below with respect to FIGS. 3 and 4A-4C for explaining a write operation according to an exemplary embodiment of the inventive concept. The write operation is performed in response to a write command wCMD, a logical address Laddr and data received from a host.

Referring to FIG. 2, the memory device 126 includes a memory array 210, and may include a page buffer 211. The access controller 125 includes a bus interface 202 (e.g., a bus controller or bus interface circuit), a buffer 204, and a write/read controller 220. The write/read controller 220 includes a first error correction code (ECC) encoder 222 (e.g., an encoding circuit), a first ECC decoder 224 (e.g., a decoding circuit), a second ECC encoder 226, and a second ECC decoder 228.

FIGS. 3, 4A-4B, and 5A-5B illustrate a method of performing a write operation according to an exemplary embodiment of the inventive concept. The method of FIG. 3 includes receiving a write command wCMD, a logical address Laddr of the main region 126-1 and data from a host (step 300). For example, the host controller 110 may send the write command wCMD, the logical address Laddr, and the data to the host interface 121. The host interface 121 may output the write command wCMD, the logical address Laddr, and the data to the bus interface (I/F) 202 of the access controller 125. As shown in FIG. 2, the data maybe temporarily stored in buffer 204. In an embodiment, the logical address Laddr is mapped to a physical address within the memory 126.

Figure 3:
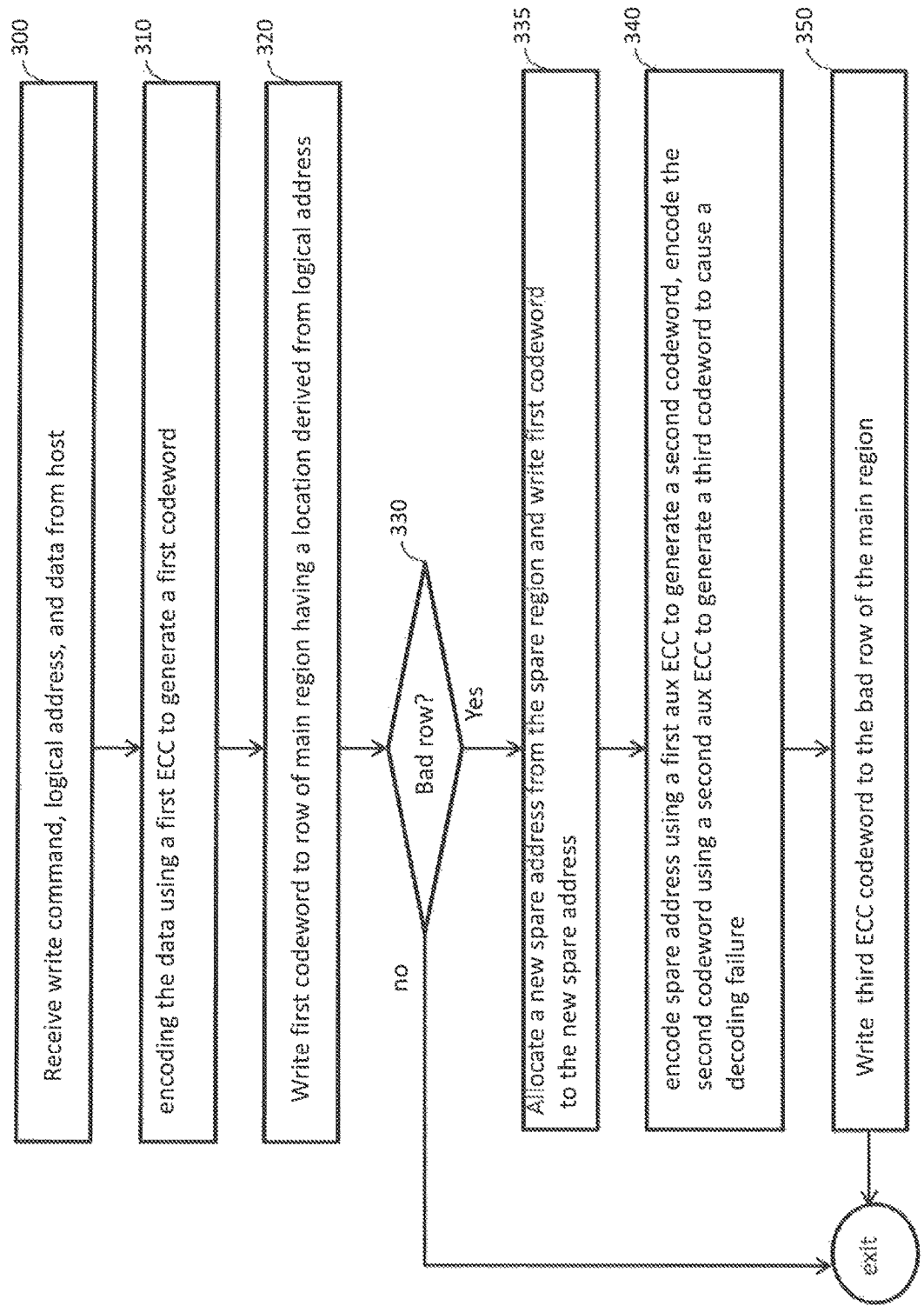
FIG. 3 illustrates a method of writing data using the controller and memory device shown in FIG. 2 according to an exemplary embodiment of the inventive concept.
Figure 5A:
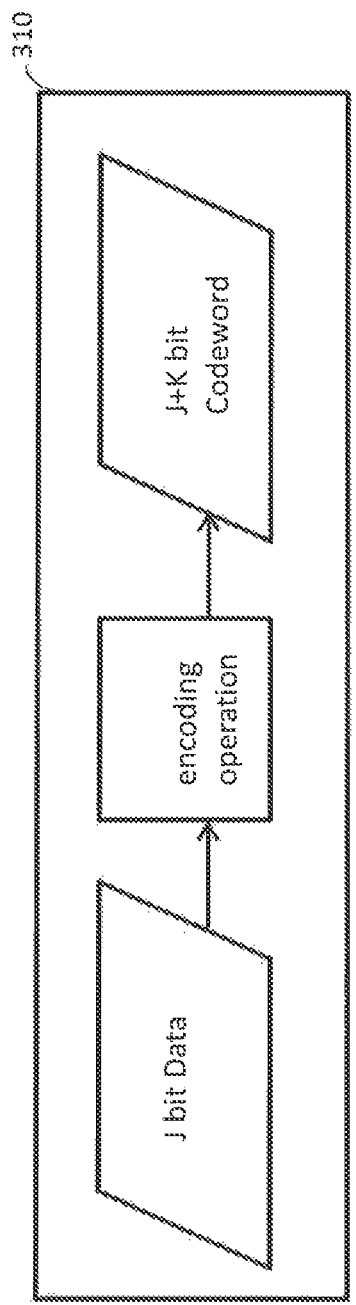
FIG. 5A illustrates exemplary data that may be produced by a step of the writing method according to an exemplary embodiment of the inventive concept.

The method of FIG. 3 includes encoding the received data according to a first error correction code (ECC) to generate a first codeword (step 310). In an exemplary embodiment, the first codeword is a Bose-Chaudhuri-Hocquenghem (BCH) code. For example, as shown in FIG. 2 and FIG. 3, the first ECC encoder 222 may perform an ECC encoding operation to generate the first codeword of step S310. As shown in FIG. 5A, encoding operation operates on J bit data to generate a J+K bit codeword (i.e., the first codeword). J and K are natural numbers. K is typically less than J, but the inventive concept is not limited thereto. In an embodiment, the first codeword includes the data and redundant information, which may be referred to as parity information when the ECC is systematic. The first ECC encoder 222 is configured to create a J+K bit codeword from J bit data that can be decoded by the first ECC decoder 224, which is able to correct a certain number of bit errors. In an embodiment, J is substantially larger than K. For example, J could be 1000 and K could be 100, but the inventive concept is not limited thereto. The ECC encoding operation may generate the first codeword as a non-systematic code. However, in an exemplary embodiment, the ECC encoding operation generates the first codeword as a systematic code, where the J bit data is included in the first codeword, and the first codeword additionally includes a K bit parity. For example, if the J bit data is present first in the first codeword, the K bit parity would then be adjacent to the J bit data.

The method of FIG. 3 further includes writing the first codeword to a row of the main region 126-2 having a location derived from the logical address Laddr. As shown in FIG. 4A, the first codeword (e.g., J+K bits) is written to a first row of a first main block among the main blocks.

The method of FIG. 3 further includes determining whether the written row is a bad row (step 330). In an exemplary embodiment, the determination is performed by reading data from the written row, comparing the received data against the read data to determine a number of errors, and determining that the row is bad when the number of errors exceeds a certain threshold. In an exemplary embodiment, the write/read controller 125 reads the data from the written row and performs the comparing. If the number of errors is less than or equal to the threshold, the method can exit since the row is considered to be good. If the number of errors exceeds the threshold, the method continues to step 335.

The method of FIG. 3 further includes allocating a new spare address from the spare region 126-2 and writing the first codeword to a location of the spare region 126-2 associated with the new spare address (step 335). For example, as shown in FIG. 4B, the first codeword is written into a first row of the first Spare Block 1 of the spare region 126-2. The first codeword being written into the first row is merely an example, as the inventive concept is not limited to any particular row of a spare block. The first codeword being written into the first spare block is merely an example, as the inventive concept is not limited to any particular spare block. In an exemplary embodiment, the spare address is L bits, where L is a natural number less than J.

In an exemplary embodiment, the access controller 125 keeps track of the last spare address used in a counter (e.g., counting circuit), increments the counter when it needs a new spare address, and uses a value of the counter as the spare address.

The writing method of FIG. 3 further includes encoding the spare address using a first auxiliary (AUX) ECC to generate a second codeword, and encoding the second codeword using a second AUX ECC to generate a third codeword guaranteed to cause a decoding failure (step 340). For example, a decoding on the third codeword always results in a failure. In an exemplary embodiment, the encoding of the second codeword is performed by encoding the second codeword using the first ECC of step S310 to generate an interim codeword and adding a vector (e.g., c) to the interim codeword to generate the third codeword. The vector c is chosen to ensure that a decoding performed on the third codeword always fails.

In an exemplary embodiment, the first ECC (e.g., a BCH code) has dimension n with a designed error-correction radius t, and a second ECC (e.g., a BCH code) has dimension n with a designed error-correction radius t−1, such that the first ECC is a subset of the second ECC. It is assumed that c is an n-symbols vector that is a codeword in the second ECC but not in the first ECC. Then, it can be shown that c has a Hamming-distance of at least 2t−1 from any codeword in the first ECC, and in particular the third codeword from above. Therefore, adding c to any codeword of the first ECC ensures that the resulting vector has a Hamming distance of at least 2t−1 from any codeword in the first ECC. Further, if the expected number of errors inflicted on such codeword is sufficiently below 2t−1, the probability of the resulting vector being decoded "successfully" to some codeword of the first ECC is extremely low. For example, the second ECC encoder 226 may perform the encoding of the spare address and the encoding of the second codeword.

Figure 5B:
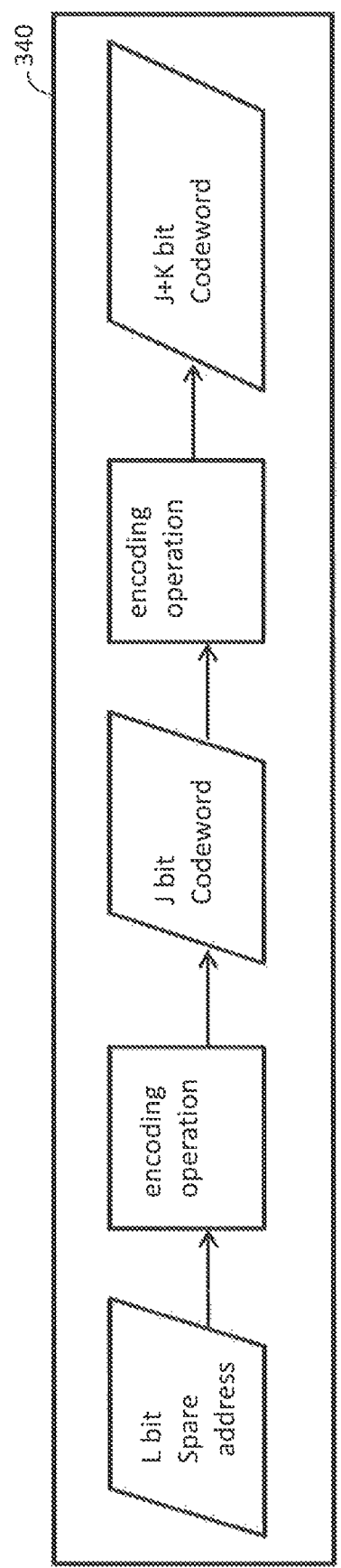
FIG. 5B illustrates exemplary data that may be produced by steps of the writing method according to an exemplary embodiment of the inventive concept.

For example, as shown in FIG. 5B, the encoding of the spare address operates on an L bit spare address to produce a J bit codeword (i.e., the second codeword), and the encoding operation on the second codeword operates on the J bit codeword to generate a J+K bit codeword. In an exemplary embodiment, the first AUX ECC used to generate the second codeword is stronger (e.g., higher overhead/data ratio) than the first ECC. In an embodiment, a stronger ECC is designed to allow an ECC decoder to error correct a greater number of bits than a weaker ECC.

The writing method of FIG. 3 further includes writing the third ECC codeword to the bad row of the main region 126-1 (step 350). In the conventional art, once a bad row is discovered, no data is ever written to the bad row. However, in embodiments of the inventive concept, this taboo is broken, and as shown in FIG. 4B, the information of the bad row is overwritten with the third codeword. The third codeword is illustrated as $3^{rd}$ codeword[$2^{nd}$ codeword[spare]]] because the third codeword is generated from the second codeword and the second codeword is generated from the spare address. As shown in FIG. 2, the W/R controller 220 may perform this overwriting by copying the third codeword to the page buffer 211, and then the memory 126 can copy the contents of page buffer 211 to the bad row of the main region 126-1. In this way, the method is able to reuse a bad row to store the spare address without requiring a separate table in an extra expensive memory like DRAM. For example, instead of storing a mapping of the logical address Laddr to the spare address in this extra memory, the spare address is stored in the bad row. Thus, the life of the memory 126 can be greatly extended, the memory 126 can store more data (i.e., increased data capacity), and the cost of manufacturing (e.g., a PRAM device) can be greatly reduced.

Figure 6:
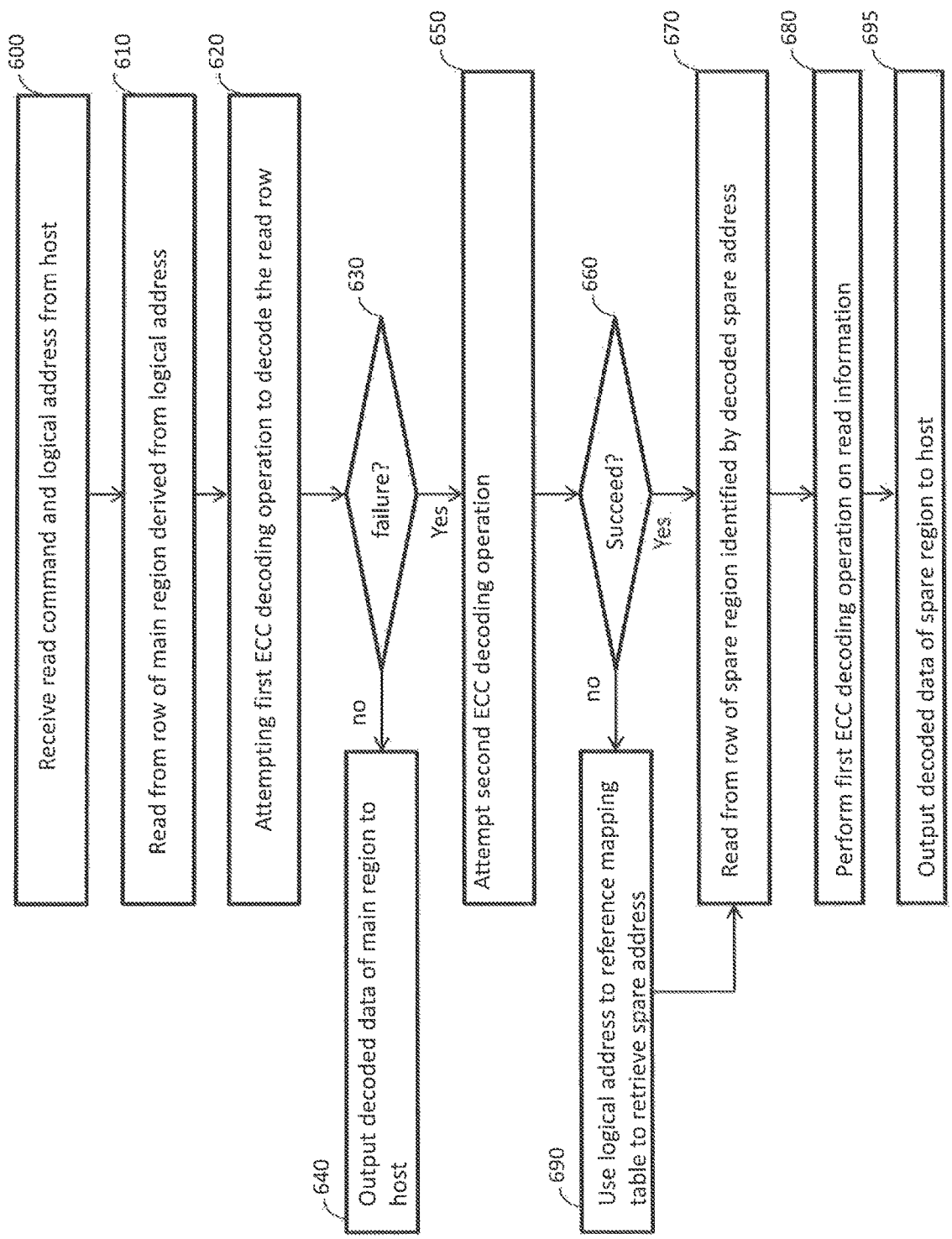
FIG. 6 illustrates a method of read data using the controller and memory device of FIG. 2 according to an exemplary embodiment of the inventive concept.

FIG. 6 illustrates a method of read data using the controller and memory device of FIG. 2 according to an exemplary embodiment of the inventive concept. Referring to FIG. 6, the reading method includes receiving a read command rCMD and a logical address Laddr of the main region 126-1 from a host (step 600). For example, the host controller 110 may send the read command rCMD and the logical address Laddr to the host interface 121, the host interface 121 may forward the read command rCMD and the logical address Laddr to the bus interface (I/F) 202 of the access controller 125, and the bus I/F 202 can output the read command rCMD and the logical address Laddr to the W/R controller 220.

The reading method of FIG. 6 further includes reading from a row of the main region 126-1 derived from the logical address Laddr (step 610). For example, in response to receiving the read command rCMD, the W/R controller 220 can read information from a row of the main region 126-1 that is derived from the logical address Laddr, and store the read information in buffer 204. If the memory 126 is configured as shown in FIG. 4A, the buffer 204 would include the first codeword. If the memory 126 is configured as shown in FIG. 4B, the buffer 204 would include the third codeword.

Figure 7:
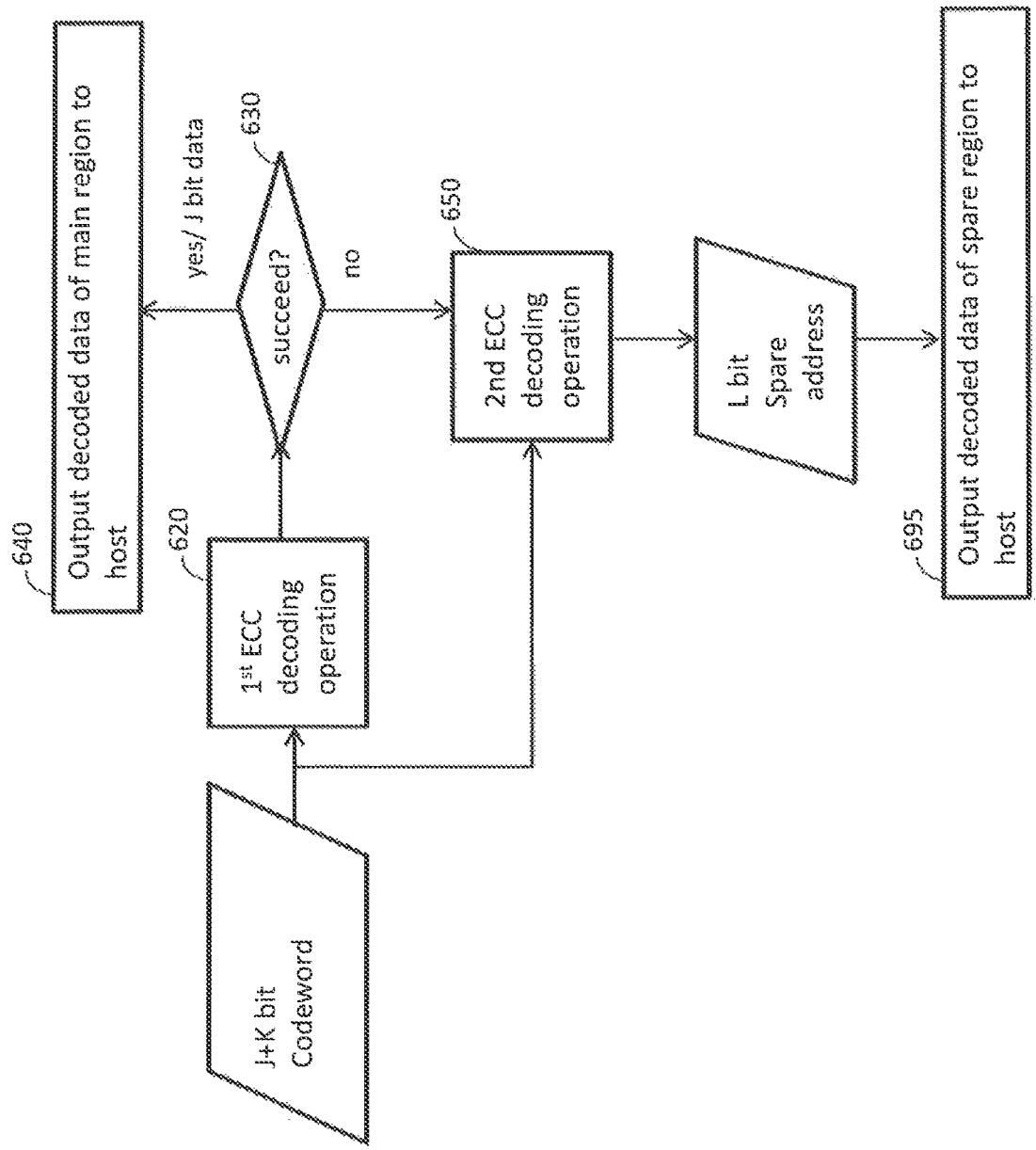
FIG. 7 illustrates exemplary data that may be produced by steps of the reading method according to an exemplary embodiment of the inventive concept.

The reading method of FIG. 6 further includes attempting a first ECC decoding operation to decode the read row (step 620). In an exemplary embodiment, the ECC decoding operation is performed using the first ECC. When the first ECC encoding operation generates a systematic code, as shown in FIG. 7, the attempting may be performed by the $1^{st}$ ECC decoder 224 performing a first ECC decoding operation using a K bit parity portion of the read row, to generate retrieve J bit data.

The method of reading then includes determining whether the decoding has failed (step 630).

If step 630 determines that the decoding was successful, then the reading method outputs the decoded data of the main region 126-1 to the host (step 640).

If step 630 determines that the decoding failed, then the reading method attempts a second ECC decoding operation to decode the read row (step 650). In an exemplary embodiment, the second ECC decoding operation is performed using the first AUX ECC. In an exemplary embodiment, the second ECC decoding operation subtracts the vector c from the read row to generate a first result, performs an ECC decoding operation on the first result using the first ECC to obtain a second result, and performs an ECC decoding operation on the second result using the first AUX ECC to obtain a spare address. As shown in FIG. 7, the attempting of the second ECC decoding operation may be performed by the second ECC decoder 228 subtracting vector c from J+K bit of the read row to generate a result and performing a decoding operation on the result using the first AUX ECC to arrive at an L bit spare address. When the read row includes J bit data and a K bit parity, and the J bit data is a non-systematic code itself, the subtracting and decoding operation is configured to generate L bit data from the J bit data. When the J bit data is a systematic code, the J bit data includes a data portion having L bits and a remainder parity portion that has a size J−L which is significantly greater than L. For example, if J is 100, L could be 10, for a data portion of 10 bits and a remainder parity portion of 90 bits. However, the inventive concept is not limited to any particular data portion and remainder parity portion sizes or ratios therebetween.

The reading method then determines whether the decoding succeeded (step 660). For example, if the decoding succeeded, the decoding returns the spare address. If the decoding failed, in an exemplary embodiment, the logical address Laddr can be used to reference a mapping table to retrieve the spare address (step 690). In an embodiment, the mapping table is located in a DRAM external to memory 125.

The method then includes reading from a row of the spare region 126-2 derived from by the spare address (step 670). For example, the W/R controller 220 may use the spare address to access the spare region 126-2 to retrieve information of the row.

Next the method includes performing the first ECC decoding operation on the row read from the spare region 126-2 (step 680). For example, the first ECC decoder 224 may perform the first ECC decoding operation on the read row. When the read row includes a non-systematic or a systematic J+K bit codeword, the first ECC decoding operation performs a decoding operation on the J+K bit codeword designed to output J bit data.

Lastly, the method includes outputting decoded data of the read row to the host (step 695). Thus, the host has no idea that it is actually reading from the spare region 126-2.

As discussed above, if the decoding of step 660 failed, the method may use the logical address Laddr to reference a mapping table to retrieve the spare address. Step 690 may be omitted, when an extra memory (e.g., DRAM) is not available to map the logical addresses to their spare addresses. When step 690 is present, the size of the extra memory is set to be smaller than a size of an extra memory that is used in the conventional art to store a mapping between logical addresses and spare addresses. The size of the extra memory may be set to be smaller since the system can rely mostly on storing spare addresses in the bad rows of the main region 126-1 and occasionally using the extra memory on rare occasions when the spare address cannot be decoded from a bad row. Thus, this 2-level approach uses less DRAM memory than a conventional 1-level approach that only has a single mapping table between the main addresses and the spare addresses. When step 690 is omitted, embodiments of the inventive concept can omit the extra memory (e.g., DRAM) used for step 690, thereby reducing the cost of manufacturing. The step 690 may be replaced with a step of passing the logical address Laddr to a hashing function that returns the spare address.

As discussed above, in an embodiment, a second ECC encoding operation is performed on the L bit spare address to arrive at a J bit codeword. In an optional embodiment, the L bits includes multiple copies of a spare address. For example, if L is 100 and a spare address is 10 bits, then the L bits could include 10 copies of the spare address. Then, when the second ECC decoding operation of step S650 is performed, it would recover these 10 copies of the spare address. However, since some of their bits could have flipped, not all the copies will be the same. The second ECC decoding operation can perform a function on all these copies to detect the actual spare address. If the function succeeds, the spare address is detected and otherwise a valid spare address cannot be detected. If the spare address is detected, the method of FIG. 6 can proceed to step 670, and otherwise the method can proceed to step 690. Thus, in this example, the bad row not only includes the spare address, but at least one backup copy of the spare address.

The above-described methods may be tangibly embodied on one or more computer readable medium(s) (i.e., program storage devices such as a hard disk, magnetic floppy disk, RAM, ROM, CD ROM, Flash Memory, etc., and executable by any device or machine comprising suitable architecture, such as a general purpose digital computer having a processor, memory, and input/output interfaces).

Figure 8:
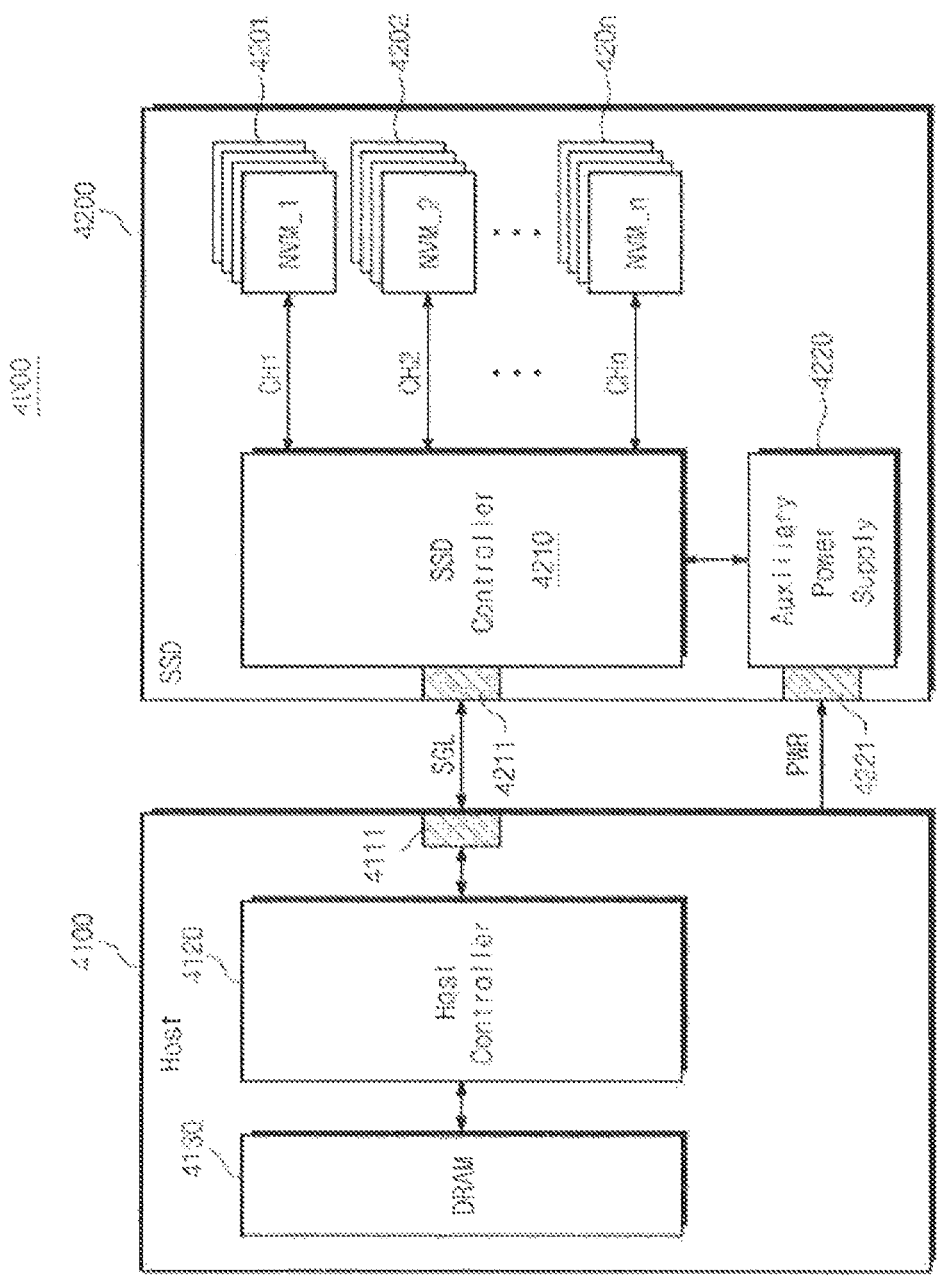
FIG. 8 is a block is a block diagram illustrating a solid state drive system according to an exemplary embodiment of the inventive concept.

FIG. 8 is a block is a block diagram illustrating a solid state drive system according to an exemplary embodiment of the inventive concept. Referring to FIG. 8 a solid state drive (SSD) system 4000 includes a host 4100 and an SSD 4200. The host 4100 includes a host interface 4111, a host controller 4120, and a DRAM 4130.

The host 4100 may write data in the SSD 4200 or read data from the SSD 4200. The host controller 4120 may transfer signals SGL such as a command, an address, a control signal, and the like to the SSD 4200 via the host interface 4111. The DRAM 4130 may be a main memory of the host 4100.

The SSD 4200 may exchange signals SGL with the host 4100 via the host interface 4211, and may be supplied with a power via a power connector 4221. The SSD 4200 may include a plurality of nonvolatile memories 4201 through 420n, an SSD controller 4210, and an auxiliary power supply 4220. Herein, the nonvolatile memories 4201 to 420n may be implemented by PRAM. The SSD controller 4210 may be implemented by the controller 125 of FIG. 1 or FIG. 2. Each of the memory devices 4201 through 420n may be implemented by the memory device 126 of FIG. 1 or FIG. 2.

The plurality of nonvolatile memories 4201 through 420n may be used as a storage medium of the SSD 4200. The plurality of nonvolatile memories 4201 to 420n may be connected with the DDS controller 4210 via a plurality of channels CH1 to CHn. One channel may be connected with one or more nonvolatile memories. Each of the channels CH1 to CHn may correspond to the data channel 130 depicted in FIG. 2. Nonvolatile memories connected with one channel may be connected with the same data bus.

The SSD controller 4210 may exchange signals SGL with the host 4100 via the host interface 4211. Herein, the signals SGL may include a command (e.g., the rCMD, the wCMD), an address (e.g., the logical address Laddr), data, and the like. The SSD controller 4210 may be configured to write or read out data to or from a corresponding nonvolatile memory according to a command of the host 4100.

The auxiliary power supply 4220 may be connected with the host 4100 via the power connector 4221. The auxiliary power supply 4220 may be charged by a power PWR from the host 4100. The auxiliary power supply 4220 may be placed within the SSD 4200 or outside the SSD 4200. For example, the auxiliary power supply 4220 may be put on a main board to supply an auxiliary power to the SSD 4200.

Although the present inventive concept has been described in connection with exemplary embodiments thereof, those skilled in the art will appreciate that various modifications can be made to these embodiments without substantially departing from the principles of the present inventive concept.

What is claimed is:

1. A memory system comprising:
   a nonvolatile memory (NVM) including a main region and a spare region; and
   a controller writing write data to a selected row of the main region and determining whether the written row is bad,
   the controller writing the write data to a spare address in the spare region and writing the spare address to the bad row, when the written row is determined to be bad.

2. The memory system of claim 1, wherein the writing of the write data to the selected row includes performing a first error correction code (ECC) encoding operation according to a first ECC on the data to generate a first codeword and writing the first codeword to the selected row.

3. The memory system of claim 1, wherein the determining whether the written row is bad comprises:
   reading from the written row to retrieve read data;
   comparing the write data with the read data to determine a number of errors; and
   comparing the number of errors against a threshold to determine whether the written row is bad.

4. The memory system of claim 3, wherein the controller determines the written row to be bad when the number exceeds the threshold.

5. The memory system of claim 2, wherein the writing of the data to the spare address in the spare region includes writing the first codeword to the spare address.

6. The memory system of claim 2, wherein the writing of the spare address to the bad row comprises:
   encoding the spare address using a first auxiliary ECC to generate a second codeword;
   encoding the second codeword using a second auxiliary ECC to generate a third codeword guaranteed to cause a decoding failure; and
   writing the third codeword to the bad row.

7. The memory system of claim 1, wherein the NVM is a phase-change memory.

8. A method for writing to a memory system, the method comprising:
   writing write data to a selected row of a main region of a nonvolatile memory (NVM) of the memory system;
   determining whether the written row is bad; and
   upon determining that the written row is bad,
   writing the data to a spare address in a spare region of the NVM; and
   writing the spare address to the bad row so the data can be accessed by referencing the bad row.

9. The method of claim 8, wherein the writing of the data to the selected row comprises:
   performing a first error correction code (ECC) encoding operation according to a first ECC on the data to generate a first codeword; and
   writing the first codeword to the selected row.

10. The method of claim 9, wherein the writing of the spare address to the bad row comprises:
    encoding the spare address using a first auxiliary ECC to generate a second codeword;
    encoding the second codeword using a second auxiliary ECC to generate a third codeword guaranteed to cause a decoding failure; and
    writing the third codeword to the bad row.

11. The method of claim 8, the determining whether the written row is bad comprises:
    reading from the written row to retrieve read data;
    comparing the write data with the read data to determine a number of errors; and
    comparing the number of errors against a threshold to determine whether the written row is bad.

12. The method of claim 8, wherein the NVM a phase-change memory.

13. A method for reading data from a memory system, the method comprising:
    performing a read to read information from a row of a main region of a nonvolatile memory (NVM) of the memory system;
    performing a first error correction code (ECC) decoding operation on the read information according to a first ECC to generate first data;
    outputting the first data to a host when the first ECC decoding operation is successful;
    performing a second ECC decoding operation on the read information to generate a spare address of a spare region of the NVM, and outputting second data that resides in the spare address to the host, when the first ECC decoding operation is not successful.

14. The method of claim 13, wherein the second ECC decoding operation subtracts a vector from the read information to generate a first result, performs a decoding operation on the first result according to the first ECC to generate a second result, and performs a decoding operation on the second result according to an auxiliary ECC to obtain the spare address.

15. The method of claim 13, wherein the read is performed in response to receiving a read command and a logical address, where a location of the row is derived from the logical address.

16. The method of claim 13, wherein the NVM is a phase-change memory.

* * * * *